(12) United States Patent
Dahl et al.

(10) Patent No.: US 7,521,726 B2
(45) Date of Patent: Apr. 21, 2009

(54) COLLIMATED LED ARRAY WITH REFLECTOR

(75) Inventors: Russell A. Dahl, Simi Valley, CA (US); Joseph W. Partlow, Simi Valley, CA (US); Stephen Proulx, Escondido, CA (US)

(73) Assignee: Illinois Tool Works Inc., Glenview, IL (US)

( * ) Notice: Subject to any disclaimer, the term of this patent is extended or adjusted under 35 U.S.C. 154(b) by 238 days.

(21) Appl. No.: 11/418,622

(22) Filed: May 4, 2006

(65) Prior Publication Data

US 2007/0215891 A1    Sep. 20, 2007

Related U.S. Application Data

(60) Provisional application No. 60/782,744, filed on Mar. 15, 2006.

(51) Int. Cl.
*H01L 33/00* (2006.01)
(52) U.S. Cl. ............... 257/98; 257/436; 257/E25.032; 362/612
(58) Field of Classification Search .................. 257/81, 257/98, 436, 749, E25.032; 362/608, 609, 362/612
See application file for complete search history.

(56) References Cited

U.S. PATENT DOCUMENTS

| 7,153,000 | B2* | 12/2006 | Park et al. ............... 362/268 |
| 2005/0218468 | A1 | 10/2005 | Owen et al. |
| 2005/0247947 | A1 | 11/2005 | Owen et al. |
| 2006/0049475 | A1 | 3/2006 | Wang et al. |

* cited by examiner

*Primary Examiner*—Quoc D Hoang
(74) *Attorney, Agent, or Firm*—Koppel, Patrick, Heybl & Dawson

(57) ABSTRACT

A light emitting diode (LED) array with beam directors outputting a high-intensity collimated beam. The LED array is constructed from a substrate component on which the LEDs and necessary electronics are disposed and a director attachment having a plurality of beam directors. The beam directors have a unique structure that is designed to shape the light beam into a collimated form. The LEDs are arranged in a pattern on the substrate, and the beam directors are arranged within the director attachment to coincide with the LEDs. The substrate and the director attachment may be manufactured and processed as separate components; they are then affixed together for operation.

12 Claims, 3 Drawing Sheets

FIG. 6
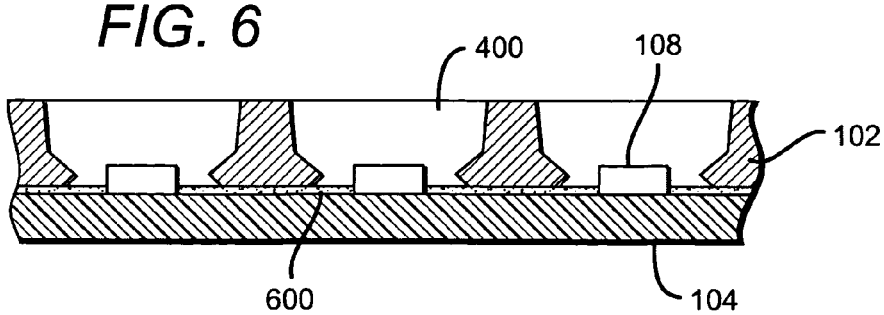
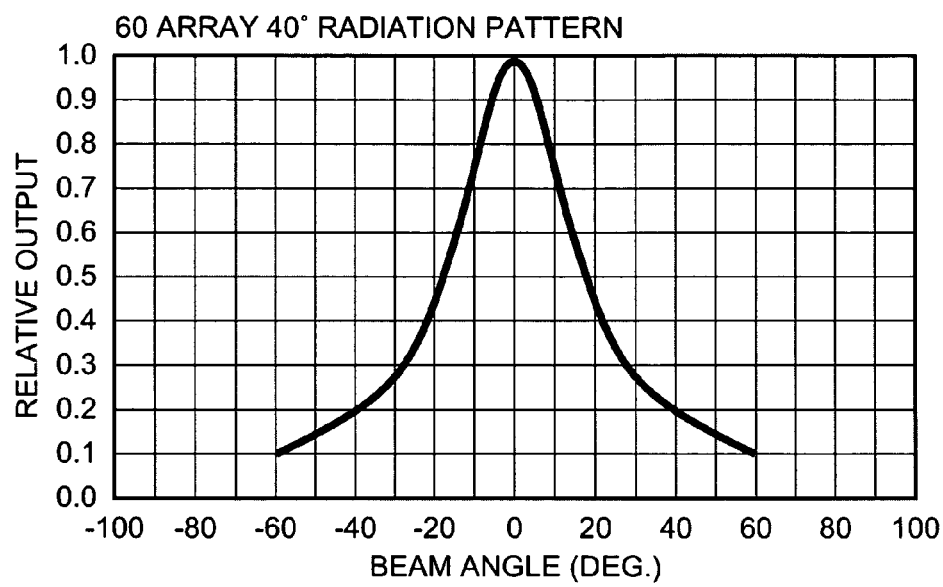
FIG. 8
FIG. 9
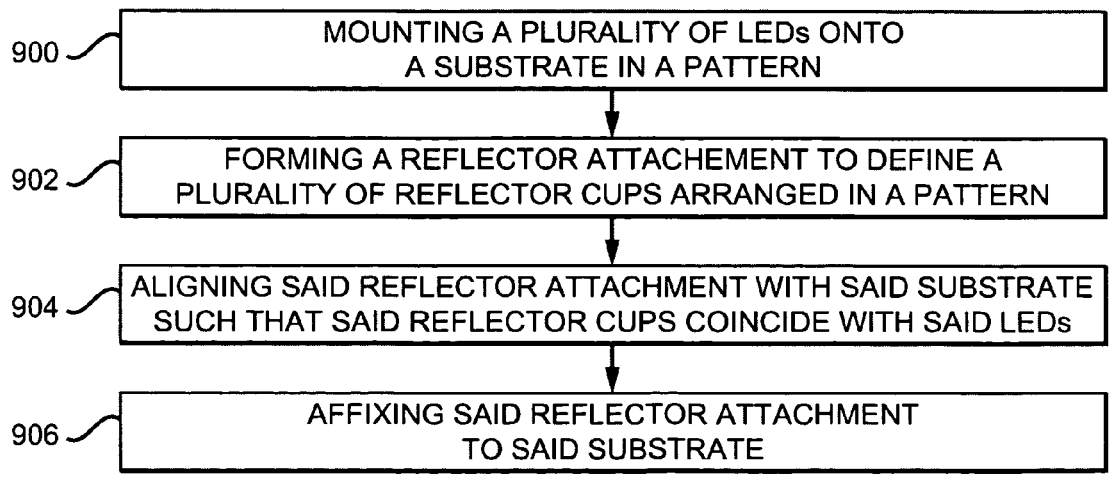

COLLIMATED LED ARRAY WITH REFLECTOR

This application claims priority to U.S. provisional application Ser. No. 60/782,744 filed on Mar. 15, 2006.

BACKGROUND OF THE INVENTION

1. Field of the Invention

The present invention relates to light emitting diodes (LEDs) and, more particularly, to LED arrays. The present invention provides a new LED array that utilizes a new beam director structure to output a beam of light.

2. Description of the Related Art

LEDs are semiconductor photon sources that can serve as highly efficient electronic-to-photonic transducers. They are typically forward-biased p-n junctions fabricated from a semiconductor material that emit light via injection electroluminescence. Their small size, high efficiency, high reliability, and compatibility with electronic systems make them very useful for a multitude of applications. Recent advancements have yielded high-power LEDs in a range of colors. This new generation of LEDs is useful in applications requiring a higher intensity light output such as high-power flash lights, airplane lighting systems, fiber-optic communication systems, and optical data storage systems.

LEDs are generally divided into classes depending on their power rating. Although there is no standard range for the different classes, low-power LEDs typically have a power rating not greater than 0.2 watts, and high-power LEDs typically have a rating of at least 1.0 watts.

Conventional packaging for low-power LEDs typically includes a reflector cup with the LED mounted at the bottom of the cup. Cathode and anode leads are electrically coupled to the LED to provide electrical power. The cathode lead can extend through the reflector cup and the anode lead can be wire bonded, or vice versa. The main function of the reflector cup is to redirect light emitted in certain directions in order to control the far-field intensity pattern of the LED.

For applications requiring a high-intensity output, LEDs are often arranged in arrays and powered with a common source. If reflector cups are used, then they must also be arranged in a matching array. It can be technically challenging and costly to create a uniform array of reflector cups. Furthermore, because various applications require a beam having specific characteristics, it can be costly to manufacture several different LED/reflector cup arrays to test and produce the required beam.

SUMMARY OF THE INVENTION

The present invention provides a light emitting diode (LED) array that produces a beam of light.

One embodiment of an LED array according to the present invention comprises a substrate; a plurality of LEDs arranged in a pattern on the substrate; an electronics component disposed on the substrate, powering said plurality of LEDs; and a director attachment affixed to the substrate, the attachment having a pattern of beam directors arranged to correspond with the LEDs.

Another embodiment of a beam forming apparatus according to the present invention comprises a power source; an array of LEDs; an electronics component driving a plurality of LEDs; a director attachment with a plurality of portions removed from said attachment such that said removed portions define a plurality of beam directors; and a housing that protects and partially surrounds said array of LEDs, said electronics component and said director attachment.

A method for fabricating an LED array is disclosed that comprises mounting a plurality of LEDs onto a substrate in a pattern; forming a director attachment to define a plurality of beam directors arranged in a pattern; aligning the director attachment with the substrate such that the beam directors coincide with the LEDs; and affixing the director attachment to the substrate.

These and other further features and advantages of the invention would be apparent to those skilled in the art from the following detailed description, taken together with the accompanying drawings, in which:

BRIEF DESCRIPTION OF THE DRAWINGS

FIG. 6 is a cross sectional view of a portion of an LED array according to the present invention;

FIG. 8 is a graph showing the relative output as a function of the beam angle, describing an embodiment of the present invention; and FIG. 9 is a flow chart of a method for fabricating an LED array.

DETAILED DESCRIPTION OF THE INVENTION

The present invention provides an LED array that is capable of outputting a beam of light. The LED array according to the present invention includes a separately formed director attachment that can be affixed to a substrate on which the LEDs are disposed. Forming the director attachment separately allows for changes to be made to the design of the individual beam directors at a later stage in the manufacturing process. Also, different director attachments having differently shaped beam directors are interchangeable with the substrate and the LEDs. The shape of the beam directors affects the characteristics of the output beam and thus can be varied to meet specific design needs.

Figure 1:
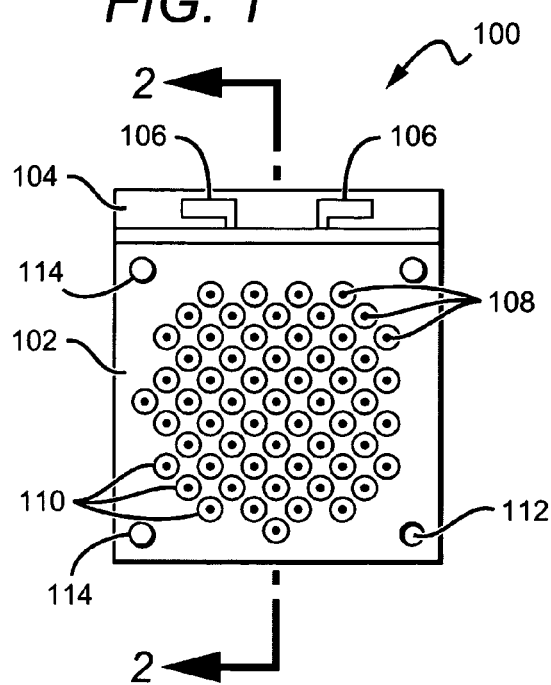
FIG. 1 is a top plan view of one embodiment of an LED array according to the present invention.

FIG. 1 shows one embodiment of an LED array 100 according to the present invention. Director attachment 102 is shown affixed to substrate 104. A portion of substrate 104 is shown protruding from under director attachment 102. Two leads 106 are disposed on substrate 104 and can be attached to a power source (not shown in FIG. 1) to drive LEDs 108. LEDs 108 are disposed on substrate 104 in a pattern. The pattern can easily be changed to achieve a different LED arrangement. Substrate 104 can be made from a material having high thermal conductivity such that heat is drawn away from the LEDs 108 and spread throughout the material.

Portions of director attachment 102 are removed (for example, cut away or ablated) to define a plurality of beam directors 110. Beam directors 110 are arranged in a pattern designed to coincide with LEDs 108. Director attachment 102 is aligned with substrate 104 prior to affixing the two pieces together. The alignment can be done by lining up the first set of guide bores 112 on director attachment 102 with the second set of guide bores 302 (shown in FIG. 3) on substrate 104. Guide pins 114 passing through both sets of guide bores may be used to facilitate the alignment process. When director attachment 102 and substrate 104 are aligned, LEDs 108 are positioned in the centers of beam directors 110 with beam directors 110 defining the only path for light emitted by LEDs 108 to escape.

Figure 2:
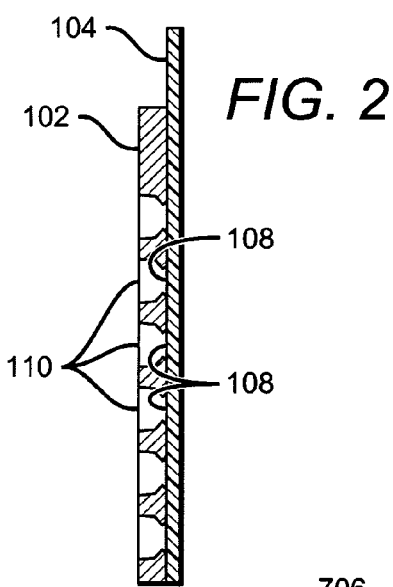
FIG. 2 is a cross sectional view of the LED array along section line 2-2.

FIG. 2 is a cross sectional view of LED array 100 along section line 2-2. Substrate 104 is shown affixed to the bottom side of director attachment 102. LEDs 108 mounted on substrate 104 are disposed in the centers of beam directors 110.

Figure 3:
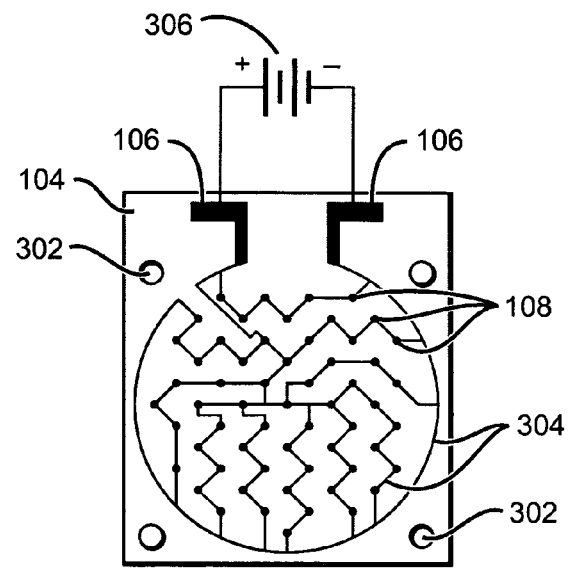
FIG. 3 is a top plan view of a substrate and an electronics component according to the present invention.

FIG. 3 shows the electronics component of the LED array disposed on substrate 104. Leads 106 electrically connect a plurality of traces 304 to power source 306. LEDs 108 are disposed along traces 304. LEDs 108 can be arranged in series or in parallel or in a combination thereof as shown in FIG. 3 so long as voltage is sufficient at each LED 108 for light emission. A second set of guide bores 302 is disposed in the corners of the substrate 104. As mentioned above, this second set of guide bores 302 can be used to align substrate 104 with director attachment 102 so that LEDs 108 are properly centered within beam directors 110.

Figure 4:
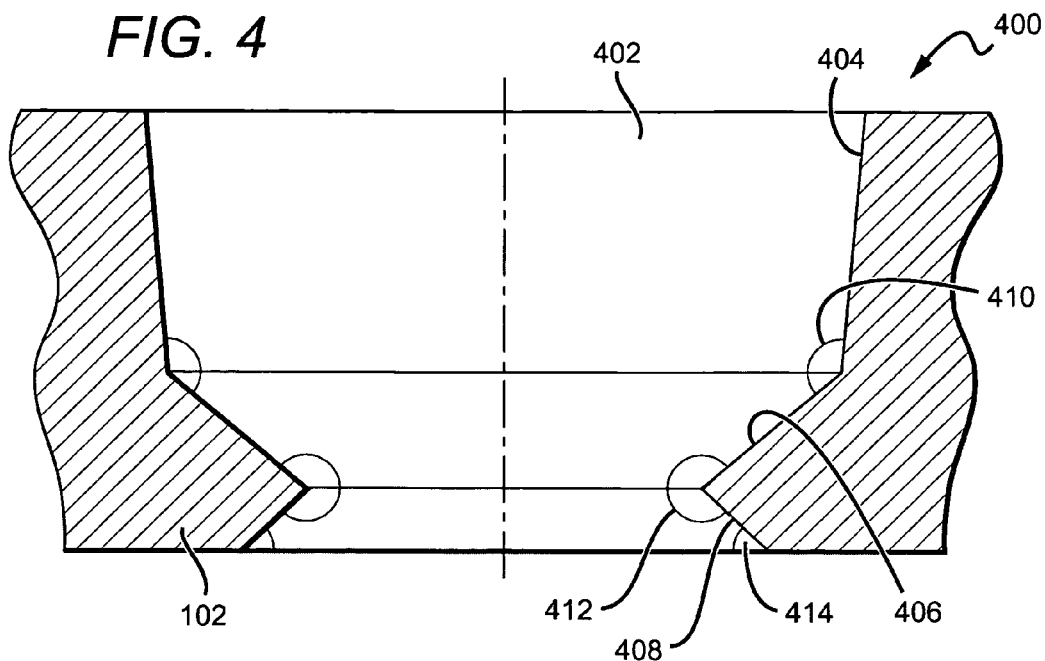
FIG. 4 is a cross sectional view of a beam director according to the present invention.

FIG. 4 is a cross sectional view of an individual beam director 400. Beam director 400 is formed by precisely machining a portion of the director attachment 102 away such that cavity 402 is formed. The remaining inner walls of director attachment 102 form beam director 400. In the preferred embodiment, a radial cross section of the beam director 400 is defined by three segments. First segment 404 forms a junction with second segment 406 defined by cup angle 410. Second segment 406 forms a junction with third segment 408 defined by flare angle 412. Third segment 408 extends to the bottom edge of director attachment 102 forming base angle 414 with a line parallel to the bottom edge of director attachment 102. Segments 404, 406 and 408 may be straight or curvilinear with the preferred embodiment having slightly curvilinear segments. Angles 410, 412 and 414 can be varied to achieve a different beam director shape, thus changing the characteristics of the output beam. The beam directors may be coated with a material designed to maximize reflection at a particular wavelength or range of wavelengths, for example, gold or silver.

Beam directors may be arranged in various patterns to accommodate different array designs. The number of beam directors in a director attachment may also vary according to design. The preferred embodiment includes 60 beam directors arranged in the pattern illustrated in FIG. 1.

Figure 5:
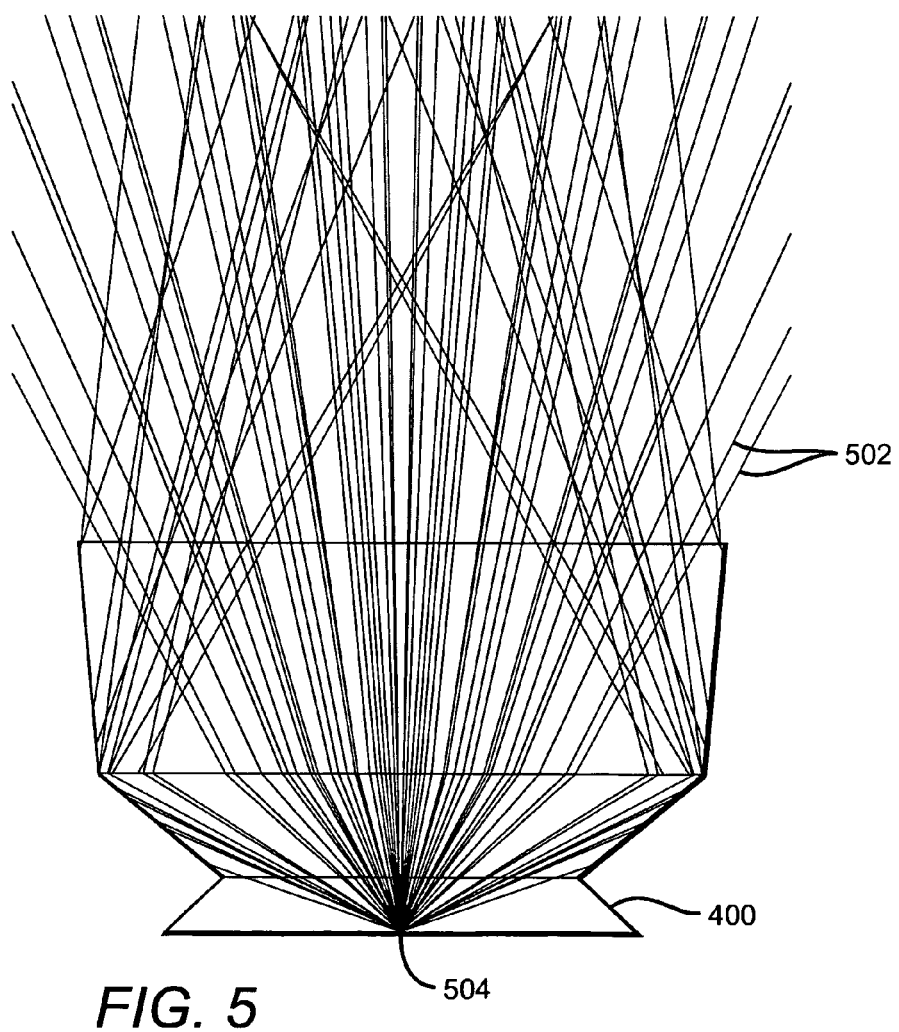
FIG. 5 is a side view of a beam director with a computer-modeled ray trace shown.

FIG. 5 shows a computer ray trace model of light interacting with one embodiment of individual beam director 400 (shown in detail in FIG. 4). Light rays 502 are traced from a light source 504 (modeled here as a point source) to the outside environment. Light rays 502 emanate omnidirectionally from light source 504. Some of light rays 502 escape the cavity of the beam director without being redirected. Some others of light rays 502 are redirected by one of the surfaces of beam director 400 and output in a direction away from the substrate (not shown here) beneath the light source. Still some others of light rays 502 are redirected by a surface of beam director 400 and travel in a direction toward the substrate. All of light rays 502 together form a beam which can be collimated. The shape of the beam is determined by the shape of beam director 400.

FIG. 5 is only meant to illustrate a computer-generated example of how light interacts with one embodiment of beam director 400. Accordingly, FIG. 5 is not meant to limit the structure or function of any elements shown therein.

FIG. 6 shows a cross sectional view of a portion of LED array 100. Director attachment 102 is shown affixed to substrate 104 with LEDs 108 mounted to substrate 104 and centered at the base of beam directors 400. Although director attachment 102 may be affixed to substrate 104 using various methods, the preferred embodiment as shown in FIG. 6 employs a layer of epoxy 600 sandwiched between director attachment 102 and substrate 104.

Figure 7:
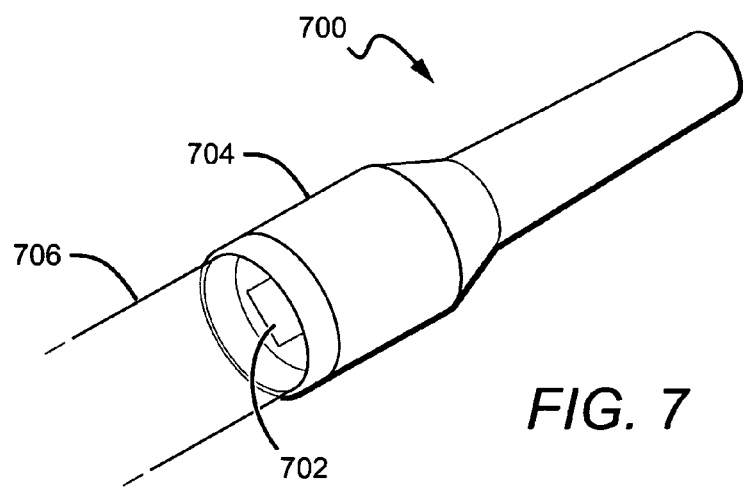
FIG. 7 is a perspective view of a high intensity lighting apparatus according to the present invention.

FIG. 7 shows a perspective view of a beam forming apparatus 700. LED array 702 is disposed inside housing 704. Housing 704 protects LED array 702 and power source (not shown) from outside elements. Housing 704 may take nearly any shape and can be made from many materials as necessitated by the application. Beam forming apparatus 700 can output a high-intensity collimated beam 706.

FIG. 8 shows a graph illustrating the characteristics of a typical beam produced by the invention as disclosed. For purposes of this description, a collimated beam is defined as having a beam angle of 50 degrees or less. The graph shows the relative output as a function of the beam angle (in degrees). The beam angle is a well known parameter in the field and is generally specified as the off-axis angle where the output power drops to 50% of the peak value. FIG. 8 shows a beam with a relative output of 0.5 (50%) at approximately −20 degrees and +20 degrees. Thus, the graph indicates a full width half maximum (FWHM), or beam angle, of 40 degrees. The preferred embodiment of the invention outputs a collimated beam with a beam angle of approximately 40 degrees.

FIG. 9 is a flowchart illustrating a process for fabricating an LED array. The process comprises mounting a plurality of LEDs onto a substrate in a pattern as shown in 900 and forming a director attachment to define a plurality of beam directors arranged in a pattern as shown in 902. Then the director attachment and the substrate are aligned such that the beam directors coincide with the LEDs as shown in 904. The director attachment is then affixed to the substrate as shown in 906. The flowchart in FIG. 9 is not meant to limit the process to any particular order for performing the steps. For example, it is not important that the LEDs be mounted to the substrate prior to machining the director attachment.

Although the present invention has been described in considerable detail with reference to certain preferred configurations thereof, numerous other variations and alternate embodiments will occur to those skilled in the art without departing from the spirit and scope of the invention. Accordingly, it is intended that the invention be limited only in terms of the appended claims.

We claim:

1. A light emitting diode (LED) array comprising:
   a substrate;
   a plurality of LEDs arranged in a pattern on said substrate;
   an electronics component disposed on said substrate, connected to power said plurality of LEDs; and
   a director attachment affixed to said substrate, said attachment having a pattern of beam directors arranged to correspond with said LEDs, wherein said beam directors have a radial cross section defined by a first segment, a second segment and a third segment; wherein the junction of said first segment and said second segment is defined by a cup angle; wherein the junction of said second segment and said third segment is defined by a flare angle; and wherein said third segment forms a base angle with a line parallel to said bottom side of said director attachment.

2. An LED array as in claim 1, said electronics component further comprising:
   at least two leads disposed on said substrate to provide power to said LEDs; and
   a plurality of traces disposed on said substrate, electrically connecting said LEDs to said leads.

3. An LED array as in claim 1, said director attachment having a top side and a bottom side, a plurality of portions cut away to define said beam directors, and a first set of guide bores disposed in the corners of said director attachment.

4. An LED array as in claim 3, said substrate further comprising:

a second set of guide bores disposed in the corners of said substrate; and wherein said first set of guide bores is designed to cooperate with said second set of guide bores to align said director attachment and said substrate.

5. An LED array as in claim 4, further comprising a set of guide pins passing through said first set of guide bores and said second set of guide bores such that the alignment of said substrate and said director attachment is maintained.

6. An LED array as in claim 1, wherein at least one of said first, second and third segments is curvilinear.

7. An LED array as in claim 1, wherein said LED array outputs a beam of light that is collimated and has a beam angle of no more than 50 degrees.

8. An LED array as in claim 1, wherein said LED array outputs a beam of light that is collimated and has a beam angle of approximately 40 degrees.

9. An LED array as in claim 1, wherein said director attachment is affixed to said substrate with epoxy.

10. An LED array as in claim 1, wherein said director attachment is coated with a material selected to maximize reflection at a specific wavelength or range of wavelengths.

11. An LED array as in claim 1, wherein said director attachment is coated with gold.

12. An LED array as in claim 1, wherein said director attachment is coated with silver.

* * * * *